United States Patent
Wu et al.

(10) Patent No.: US 7,196,423 B2
(45) Date of Patent: Mar. 27, 2007

(54) INTERCONNECT STRUCTURE WITH DIELECTRIC BARRIER AND FABRICATION METHOD THEREOF

(75) Inventors: Zhen-Cheng Wu, Kaohsiung (TW); Ying-Tsung Chen, Chiayi (TW); Yun-Cheng Lu, Taipei (TW); Syun-Ming Jang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 253 days.

(21) Appl. No.: 10/811,186

(22) Filed: Mar. 26, 2004

(65) Prior Publication Data

US 2005/0212135 A1    Sep. 29, 2005

(51) Int. Cl.
*H01L 23/48* (2006.01)
(52) U.S. Cl. .................... 257/774; 257/758
(58) Field of Classification Search ........... 257/522, 257/758, 774
See application file for complete search history.

(56) References Cited

U.S. PATENT DOCUMENTS

| 6,265,321 | B1 * | 7/2001 | Chooi et al. ............... 438/725 |
| 6,352,917 | B1 * | 3/2002 | Gupta et al. ............... 438/622 |
| 6,358,842 | B1 * | 3/2002 | Zhou et al. ................ 438/633 |
| 6,391,783 | B1 * | 5/2002 | Sudijono et al. ........... 438/700 |
| 6,492,256 | B2 * | 12/2002 | Lee et al. .................. 438/619 |
| 6,890,850 | B2 * | 5/2005 | Lee et al. .................. 438/631 |
| 6,946,391 | B2 * | 9/2005 | Tsai et al. .................. 438/638 |
| 6,967,156 | B2 * | 11/2005 | Lim et al. .................. 438/622 |

* cited by examiner

*Primary Examiner*—Roy Potter
(74) *Attorney, Agent, or Firm*—Thomas, Kayden, Horstemeyer & Risley

(57) ABSTRACT

An interconnect structure with dielectric barrier and fabrication thereof. The interconnect structure includes a semiconductor substrate and a plurality of stacked structures formed thereon, each stacked structure including a conductive line and a conductive plug thereon. A conformal dielectric barrier is formed over the surfaces of the stacked structures and a blanket second dielectric layer is formed over the dielectric barrier to form an inter-metal layer.

24 Claims, 4 Drawing Sheets

INTERCONNECT STRUCTURE WITH DIELECTRIC BARRIER AND FABRICATION METHOD THEREOF

BACKGROUND

The present invention relates to semiconductor fabrication and in particular to fabrication of an interconnect with dielectric barrier.

Electrically conductive lines for, for example, signal transferring are essential in electrical devices as well as in semiconductor integrated circuit (IC) devices. The electrically conductive lines on different levels are connected by electrically conductive plugs in required position, providing a predetermined function.

Recently, fabrication using copper has been introduced to solve problems such as RC delay caused by device feature size reduction responding to demands of increased device integrity. Moreover, copper also shows better heat conductivity, thus providing better electromigration resistance than conventional aluminum. Copper fabrication compatible with low dielectric constant (low-k) dielectric material has become a leading interconnect process in IC industry.

Nevertheless, one disadvantage of the copper fabrication is copper diffusing to the adjacent dielectric material, thus affecting reliability of the IC device, such that a metal barrier layer comprising material such as Ta or TaN is needed for diffusion suppression.

Moreover, another disadvantage of copper fabrication is the difficulty of copper etching, such that the copper fabrication is normally performed by damascene process, wherein a dielectric layer with a patterned opening for formation of a conductive layer therein is first formed by photolithography and subsequent etching. Next, a metal barrier and the copper metal sequentially fill the opening and unnecessary portions thereof beyond the opening are removed by planarization such as chemical mechanical polishing (CMP).

A conventional damascene process for forming interconnects is illustrated in cross section in FIGS. 1A–1C for better understanding.

In FIG. 1A, a semiconductor substrate 10 such as a silicon wafer with semiconductor devices or other existing conductive lines thereon is first provided, illustrated as a flat substrate 10 here for simplicity. Next, a first dielectric layer 12 is formed over the substrate 10 by a method such as chemical vapor deposition (CVD). A plurality of openings OP are then formed in the first dielectric layer 12 as metal layer patterns using known photolithography and etching. After formation of the openings OP, a first barrier layer 14 is conformably formed in each opening OP, covering the bottom surface and sidewalls thereof. Next, copper is formed over the first barrier layer 14, filling the openings OP, using electroplating. A planarization step such as chemical mechanical polishing (CMP) is then performed to remove unnecessary copper from the first dielectric layer 12, thus leaving first metal layer 16 in the openings, serving as conductive lines.

In FIG. 1B, an etching stop layer 18 and a second dielectric layer 20 are then deposited by, for example, chemical vapor deposition. Second openings OP', each exposing a portion of the first metal layer 16 thereunder, are then formed in the second dielectric layer 20 and the etching stop layer 18 by known photolithography and etching, providing spaces for forming conductive plugs.

In FIG. 1C, a second barrier layer 22 is then conformably formed on the bottom surface and the sidewalls of each second opening OP'. Next, copper is formed over the second dielectric layer 20, filling the second openings OP' by, for example, electroplating. Another planarization step such as chemical mechanical polishing (CMP) is performed to remove unnecessary copper from the second dielectric layer 20, thus leaving a second metal layer 24 in the second openings, serving as a conductive plug.

As shown in FIG. 1C, the barrier layers (referring to the first barrier 14 and the second barrier 22) typically comprise Ta or TaN (PVD) at a thickness of about 100–500 Å, formed by physical vapor deposition. These barrier layers are formed by physical vapor deposition and serve as diffusion barriers, suppressing diffusion of ions of the metal material, such as copper, from the conductive lines or conductive plugs (referring to the first metal layer 16 and the second metal layer 24) into the adjacent dielectric layers. In addition, the barrier layers also enhance adhesion of metal material of the metal layers to the dielectric layers.

Reliability problems, however, still may occur during damascene process using porous low-K material and the described metal barrier. The existing etching stop layer 18 also provides a possible leakage pathway, thus damaging testing results such as line-to-line leakage, time dependant dielectric breakdown (TDDB), RC delay or electromigration (EM) of an IC device.

SUMMARY

Accordingly, an object of the invention is to provide a method and structure to enhance reliability and avoid problems such as line-to-line leakage, TDDB, RC delay and EM of interconnect structures.

Accordingly, the present invention provides a method for fabricating an interconnect structure with dielectric barrier, comprising providing a semiconductor substrate with a first dielectric layer sequentially formed thereon, wherein a plurality of conductive lines are formed with a conductive plug thereon in the first dielectric layer. The first dielectric layer is then removed to leave a plurality of stacked structures formed by the conductive line and the conductive plug thereon. A conformal dielectric barrier is then formed on surfaces of the stacked structures and a second dielectric layer is blanketly formed over the dielectric barrier to form an inter-metal dielectric (IMD) layer for insulating the stacked structures.

Moreover, the invention provides an interconnect structure with dielectric barrier, comprising a semiconductor substrate and a plurality of stacked structures formed thereon, wherein each stacked structure comprises a conductive line and a conductive plug thereon. A conformal dielectric barrier is formed over the surfaces of the stacked structures and a blanket second dielectric layer is formed over the dielectric barrier to form an inter-metal layer for insulation.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DESCRIPTION

Figure 1A:
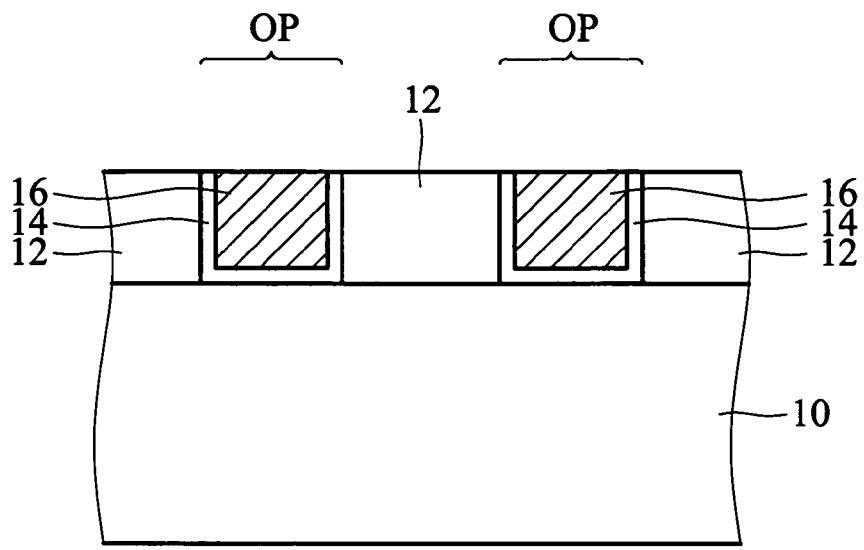
FIGS. 1A–1C are cross sections of a conventional damascene process as referenced in the Related Art.
Figure 1B:
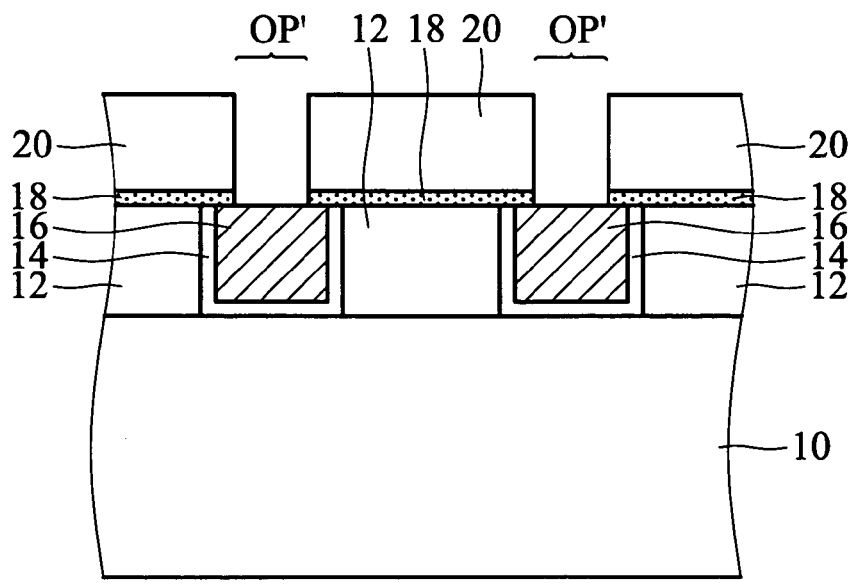
Figure 1C:
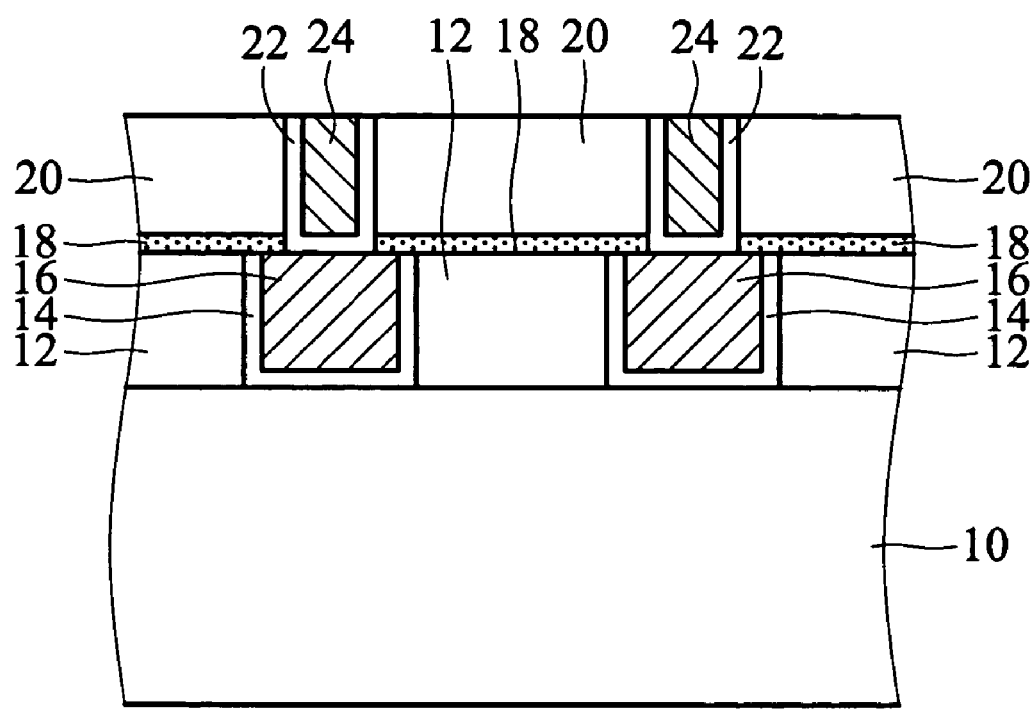

A preferred embodiment showing a method for fabricating interconnect structures with dielectric barriers is illustrated through FIGS. 2A–2D. First, a semiconductor substrate 100, for example a silicon wafer with semiconductor devices or other existing conductive lines formed thereon is first provided, illustrated as a flat substrate 100 here for simplicity. Next, an etching stop layer 120 and a dielectric layer 140 are sequentially formed over the substrate 100 by, for example, chemical vapor deposition (CVD). The etching stop layer 120 here may comprise oxygen-containing material such as silicon oxycarbide (SiCO) or silicon carbonitride (SiCN) and the thickness thereof is about 300–500 Å. The dielectric layer 140 here may comprise oxygen-free material such as porous-SiLK (P-siLK), available from Dow Chemical, or other porous low dielectric constant (low-K) material. Next, a plurality of openings OP are formed in the dielectric layer 140 and the etching stop layer 120, providing spaces for forming conductive lines by known photolithography and etching. After formation of openings OP, a layer of first barrier material with a thickness of about 100–300 Å is conformably formed over the dielectric layer 140 and in the openings OP. The first barrier material is then etched to leave a first barrier layer 160 on sidewalls of the openings OP, each contacting a portion of the substrate 100 thereunder. Next, metal material such as copper or copper aluminum copper alloy fills the openings OP and covers the dielectric layer 140. A planarization step such as chemical mechanical polishing (CMP) is then performed to remove unnecessary material from the dielectric layer 140, thus leaving first metal layer 180 in the openings OP, serving as conductive lines.

Figure 2A:
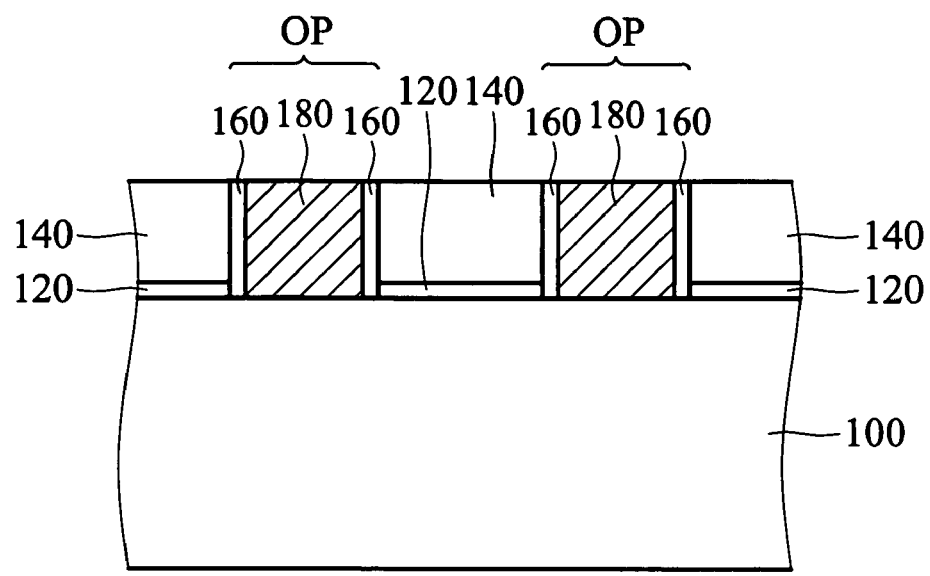
FIGS. 2A–2D are cross sections of a method for fabricating interconnect structures in accordance with one embodiment of the invention.
Figure 2B:
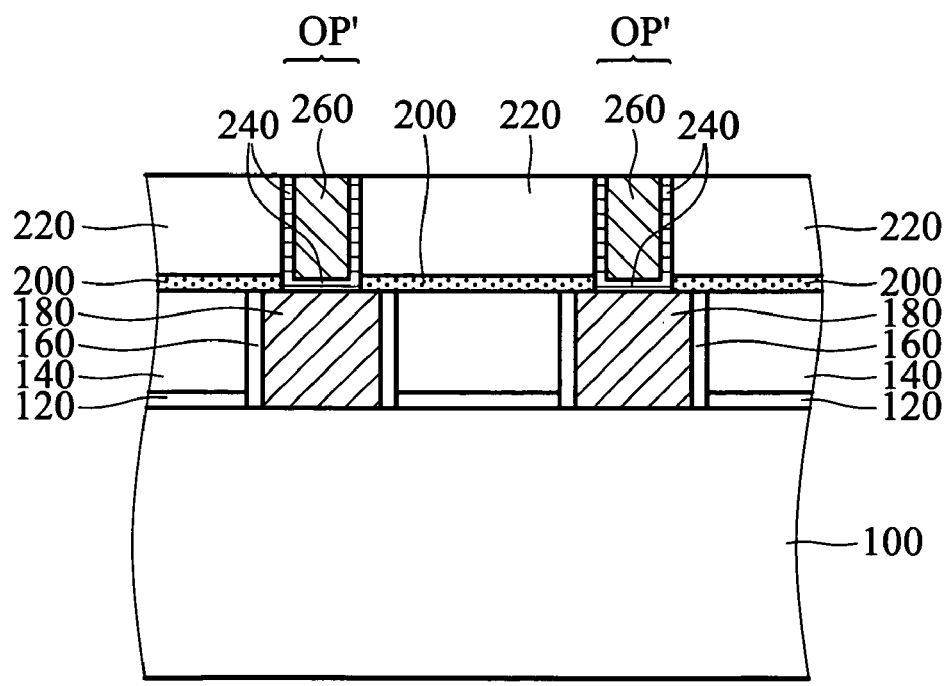

In FIG. 2B, a second etching stop layer 200 and a second dielectric layer 220 are then sequentially deposited over the dielectric layer 140, the metal line layer 180 and the first barrier layer 160, wherein the thickness of the second etching stop layer 200 is about 400–600 Å and material thereof comprises pure silicon carbide (SiC) and preferably P-SiLK or other porous low-k material. Next, a plurality of second openings OP', each exposing a portion of the first metal layer 16 thereunder, are formed in the second dielectric layer 220 and the second etching stop layer 200 by known photolithography and etching, serving as spaces for subsequent conductive plugs. Next, another deposition is performed to conformably form a second barrier material over the second openings OP' and the second dielectric layer 220 as a passvation layer 240 on the second openings OP'. Thickness thereof is 20–50 Å and material thereof can be metal such as Ta.

Next, copper or copper aluminum alloy fills the second openings OP' and covers the second dielectric layer 220. A planarization step such as chemical mechanical polishing (CMP) is then performed to remove unnecessary portions from the second dielectric layer 220, thus leaving second metal layer 260 and the adjacent passivation layer 240 in each second openings OP', serving as an conductive plug. The dielectric layer 140, the second dielectric layer 220 and the second etching stop layer 200 thus constitute a first dielectric layer of oxygen-free material.

Figure 2C:
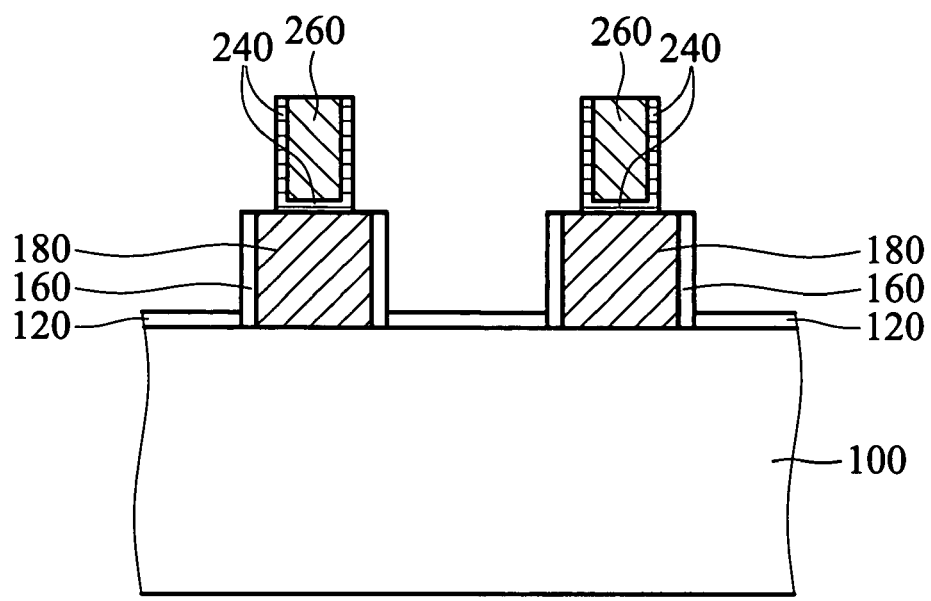

In FIG. 2C, etching is then performed to remove all the oxygen-free material in the first dielectric layer (referring to the dielectric layer 140, 220 and the second etching stop layer 200) and stops on the etching stop layer 120 according to oxygen-containing differences, thus leaving a plurality of stacked structures, each comprising the second metal layer 260 with surrounding passivation layer 240 stacked over the first metal layer 180 with adjacent first barrier layer 160. The described etching can use etchant gases comprising $N_2$ and $H_2$, showing a high etching selectivity between oxygen-containing material and oxygen-free material.

Figure 2D:
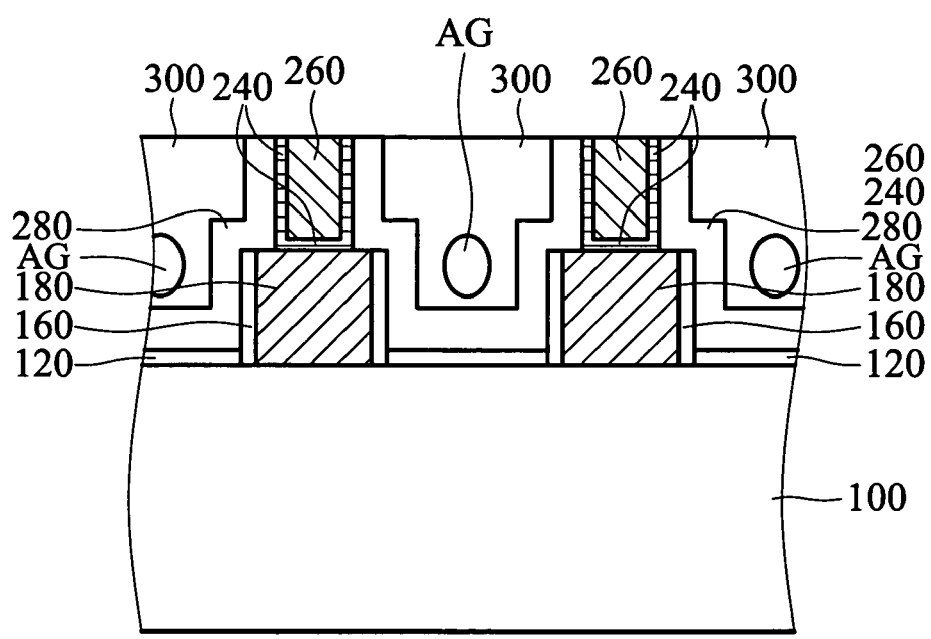

In FIG. 2D, a layer of second barrier material such as silicon oxycarbide (SiCO) or silicon carbonitride (SiCN) with a dielectric constant about 4.5–5.0 is then conformably formed over the stacked structures at thickness of about 100–300 Å. The fabrication method used can be plasma enhanced chemical vapor deposition (PECVD). A dielectric barrier for each stacked structure (referring to the first metal layer 180, the first barrier layer 160, the second metal layer 260 and the passivation layer 240) is thus formed over the substrate 100.

Next, another dielectric material is blanketly formed over the second barrier material. Unnecessary portions of the dielectric material and the second barrier material over the stacked structures are then removed by a planarization step, thus leaving a second dielectric layer 300 and a dielectric barrier layer 280 between adjacent stacked structures for insulating purpose. As shown in FIG. 2D, the dielectric barrier layer 280 is disposed along sidewalls of adjacent stacked structures and the substrate 100 therebetween, preventing the formation of the leakage pathway caused by the conventional etching stop layer near the conductive plugs. Material of the second dielectric layer 300 can be, for example, carbon-incorporating silicon oxide (SiOC) with a dielectric constant of about 2.5–3.0. Due to device feature size reduction of the conductive lines and the conductive plugs, air gaps AG may inevitably formed in the dielectric layer 300. Air therein presents a dielectric constant of 1, thus lowering the bulk dielectric constant of the dielectric layer 300.

The interconnect structure fabricated by the method of the invention, as shown in FIG. 2D, includes a semiconductor substrate (referring to the substrate 100), a plurality of stacked structures (referring to the second metal layer 260, the passiviation layer 240, the first metal layer 180 and the first barrier layer 160) formed thereon, wherein each stacked structure comprises a conductive line and a conductive plug thereon. A conformal dielectric barrier (referring to the second barrier layer 280) formed over the surfaces of the stacked structures and a blanket second dielectric layer (referring to the second dielectric layer 300) formed over the dielectric barrier to form an inter-metal layer for iusulation.

The present invention provides an interconnect structure surrounded by a dielectric barrier with the material thereof silicon oxynitride or silicon carbonitride with a dielectric constant of about 4.5–5.0. The conductive line and the conductive plug are thus passivated, preventing metal diffusion. Moreover, a possible leakage pathway along the etching stop layer adjacent to the conductive plugs does not exist in the interconnect structure of the invention such that reliability factors such as line-to-line leakage, time dependant dielectric breakdown (TDDB), RC delay or electromigration (EM) thereof are thus enhanced. Furthermore, the air-gaps (AG) formed between the second dielectric layer between the adjacent stacked structures reduce the overall dielectric constant thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interconnect structure with dielectric barrier, comprising:
   a semiconductor substrate;
   a plurality of stacked structures formed the semiconductor substrate, wherein each stacked structure comprises a conductive line and a conductive plug;
   a conformal dielectric barrier fully covering the sidewall surfaces of the stacked structures; and
   a blanket second dielectric layer formed over the conformal dielectric barrier to form an inter-metal layer for insulating the stacked structures.

2. The interconnect structure as claimed in claim 1, further comprising an etching stop layer disposed between the semiconductor substrate and the conformal dielectric barrier.

3. The interconnect structure as claimed in claim 1, wherein the etching stop layer comprises oxygen-containing material.

4. The interconnect structure as claimed in claim 3, wherein the oxygen-containing material comprises silicon oxycarbide (SiCO) or silicon carbonitride (SiCN).

5. The interconnect structure as claimed in claim 1, wherein the first dielectric layer comprises a plurality of oxygen-free dielectric layers.

6. The interconnect structure as claimed in claim 5, wherein the oxygen-free dielectric layers comprise silicon carbide, P-SiLK or other porous low-k dielectric.

7. The interconnect structure as claimed in claim 1, wherein the conductive line comprises copper or copper aluminum alloy.

8. The interconnect structure as claimed in claim 1, wherein the conductive plug comprises copper or copper aluminum alloy.

9. The interconnect structure as claimed in claim 1, wherein the dielectric barrier comprises silicon oxycarbide (SiCO) or silicon carbonitride (SiCN) with a dielectric constant of 4.5–5.0.

10. The interconnect structure as claimed in claim 1, wherein the second dielectric layer comprises carbon-incorporated silicon oxide (SiOC) with a dielectric constant of 2.5–3.0.

11. The interconnect structure as claimed in claim 1, further comprising at least one air-gap in the second dielectric layer between the stacked structures.

12. An interconnect structure with dielectric barrier, comprising:
    a semiconductor substrate;
    a pair of stacked structures formed on the semiconductor substrate, wherein each stacked structure comprises a conductive line and a conductive plug; and
    a conformal dielectric barrier fully covering sidewalls of each stacked structure.

13. The interconnect structure as claimed in claim 12, further comprising a blanket second dielectric layer formed on the dielectric barrier to form an inter-metal layer.

14. The interconnect structure as claimed in claim 12, wherein the dielectric barrier is disposed along the substrate between the stacked structures.

15. The interconnect structure as claimed in claim 12, further comprising an etching stop layer disposed between the semiconductor substrate and the dielectric barrier.

16. The interconnect structure as claimed in claim 15, wherein the etching stop layer comprises oxygen-containing material.

17. The interconnect structure as claimed in claim 16, wherein the oxygen-containing material comprises silicon oxycarbide (SiCO) or silicon carbonitride (SiCN).

18. The interconnect structure as claimed in claim 12, wherein the first dielectric layer comprises a plurality of oxygen-free dielectric layers.

19. The interconnect structure as claimed in claim 18, wherein the oxygen-free dielectric layers comprise silicon carbide, P-SiLK or other porous low-k dielectric.

20. The interconnect structure as claimed in claim 12, wherein the conductive line comprises copper or copper aluminum alloy.

21. The interconnect structure as claimed in claim 12, wherein the conductive plug comprises copper or copper aluminum alloy.

22. The interconnect structure as claimed in claim 12, wherein the dielectric barrier comprises silicon oxycarbide (SiCO) or silicon carbonitride (SiCN) with a dielectric constant of 4.5–5.0.

23. The interconnect structure as claimed in claim 13, wherein the second dielectric layer comprises carbon-incorporated silicon oxide (SiOC) with a dielectric constant of 2.5–3.0.

24. The interconnect structure as claimed in claim 13, further comprising at least one airgap in the second dielectric layer between the stacked structures.

* * * * *